US009244126B2

(12) United States Patent
Sartschev et al.

(10) Patent No.: US 9,244,126 B2
(45) Date of Patent: Jan. 26, 2016

(54) AUTOMATED TEST SYSTEM WITH EVENT DETECTION CAPABILITY

(71) Applicants: Ronald A. Sartschev, Andover, MA (US); Edward J. Seng, Andover, MA (US); Marc Reuben Hutner, Toronto (CA)

(72) Inventors: Ronald A. Sartschev, Andover, MA (US); Edward J. Seng, Andover, MA (US); Marc Reuben Hutner, Toronto (CA)

(73) Assignee: Teradyne, Inc., North Reading, MA (US)

( * ) Notice: Subject to any disclaimer, the term of this patent is extended or adjusted under 35 U.S.C. 154(b) by 161 days.

(21) Appl. No.: 14/073,739

(22) Filed: Nov. 6, 2013

(65) Prior Publication Data
US 2015/0128003 A1    May 7, 2015

(51) Int. Cl.
*G01R 31/319* (2006.01)
*G01R 31/317* (2006.01)
*H04L 1/24* (2006.01)
*H04L 27/38* (2006.01)
*H04L 27/20* (2006.01)
*H04L 27/22* (2006.01)
*H04L 27/00* (2006.01)
(Continued)

(52) U.S. Cl.
CPC .... *G01R 31/31922* (2013.01); *G01R 31/31703* (2013.01); *G01R 31/31722* (2013.01); *G01R 31/31727* (2013.01); *G01R 31/31917* (2013.01); *G01R 31/31928* (2013.01); *G01R 31/31932* (2013.01); *G01R 31/318594* (2013.01); *H04L 1/242* (2013.01); *H04L 27/0008* (2013.01); *H04L 27/2053* (2013.01); *H04L 27/22* (2013.01); *H04L 27/38* (2013.01)

(58) Field of Classification Search
CPC .................. G01R 31/31922; G01R 31/31917; G01R 31/31928; G01R 31/31932; G01R 31/31722; G01R 31/31703; G01R 31/31727; G01R 31/318594; H04L 27/38; H04L 27/2053; H04L 27/22; H04L 27/0008; H04L 1/242
USPC ............ 714/744, 742, 724, 731, 700; 702/66, 702/69, 79; 327/160, 161; 324/76.12, 324/762.01
See application file for complete search history.

(56) References Cited

U.S. PATENT DOCUMENTS 6,349,267 B1    2/2002  Goldthorp et al.
6,784,819 B2 *  8/2004  Chow ........................... 341/155
(Continued)

OTHER PUBLICATIONS

International Search Report and Written Opinion of the International Searching Authority for International Application No. PCT/US2014/061933 dated Jan. 26, 2015.

*Primary Examiner* — John J Tabone, Jr.
(74) *Attorney, Agent, or Firm* — Wolf, Greenfield & Sacks, P.C.

(57) ABSTRACT

A test technique that may be implemented in an automated test system for testing semiconductor devices. The test technique may enable the fast detection of a signal transition, such as an edge, within a waveform and the timing of that event. Circuitry within a digital instrument that can be quickly and flexibly programmed may, at least in part, implement the test technique. That circuitry may be simply programmed with testing parameters, such that application of the technique may lead to faster test development and faster times. In operation, that circuitry receives parameters specifying parameters of a window over a waveform in which samples of the waveform will be taken to detect the signal transition. The circuitry may convert these parameters into control signals for other components in the test system, such as an edge generator or pin electronics, to take a programmed number of samples at desired times.

29 Claims, 6 Drawing Sheets

(51) Int. Cl.
  *G01R 31/3193* (2006.01)
  *G01R 31/3185* (2006.01)

(56) References Cited

U.S. PATENT DOCUMENTS

| | | | |
|---|---|---|---|
| 7,349,818 B2 | 3/2008 | Panis | |
| 7,573,957 B2 | 8/2009 | Sartschev et al. | |
| 7,668,235 B2 | 2/2010 | Panis et al. | |
| 7,856,578 B2 | 12/2010 | Sartschev et al. | |
| 8,879,659 B1 * | 11/2014 | Olgaard | 375/267 |
| 2004/0001017 A1 * | 1/2004 | Chow | 341/155 |
| 2004/0122620 A1 | 6/2004 | Doi et al. | |
| 2008/0109579 A1 | 5/2008 | Liu | |
| 2009/0228227 A1 | 9/2009 | Suda | |
| 2011/0057642 A1 | 3/2011 | Watanabe et al. | |
| 2013/0260485 A1 * | 10/2013 | van der Wagt et al. | 438/17 |
| 2014/0143600 A1 * | 5/2014 | Hutner et al. | 714/35 |
| 2014/0207402 A1 * | 7/2014 | Ferry | 702/119 |
| 2014/0269871 A1 * | 9/2014 | Huynh | 375/224 |
| 2014/0361798 A1 * | 12/2014 | Johnson et al. | 324/750.02 |
| 2015/0063133 A1 * | 3/2015 | Olgaard et al. | 370/252 |
| 2015/0074653 A1 * | 3/2015 | Eracar et al. | 717/129 |

* cited by examiner

AUTOMATED TEST SYSTEM WITH EVENT DETECTION CAPABILITY

BACKGROUND

Automatic test equipment (ATE) (referred to generally as a "tester") is used to test semi-conductor devices during their manufacture. Functional testing is typically performed by configuring a tester to apply electrical signals to numerous points on the device under test (DUT) while measuring the output response of the DUT at certain points.

In some scenarios, testers are used to test DUTs to identify defects at least once during the process of manufacturing the DUTs. The results of testing can be used to determine whether a DUT behaves as designed. If the device behaves as designed, the device may be packaged and shipped to a customer. If tests indicate that the device does not behave as designed, the device is often diverted to further manufacturing steps, such as repair or disposal.

To generate and measure test signals required to test a semiconductor device, a tester includes circuitry, sometimes called pin electronics, that can be controlled to generate and/or measure a test signal. Testers can be programmed to generate and measure test signals at each of multiple test points on a device under test in each of multiple cycles of tester operation by specifying an operation of the pin electronics. For each cycle of tester operation, the test program may specify an action for each pin electronics circuit coupled to a test point. The programming may define what that action is, such as driving a HI or LO signal or measuring whether the DUT is outputting a HI or LO signal. The programming may also specify the timing of that action relative to the start of the tester cycle. In this way, a test program may be built up to apply a wide range of stimulus signals to a DUT and to measure whether the DUT produces an expected response. However, specifying operations and timing for the many test points required to fully test a DUT can be time consuming.

Current semiconductor devices are quickly superseded by the next generation of semiconductor devices. To justify the large expense of designing a complex semiconductor device and establishing a manufacturing facility, semiconductor manufacturers seek to manufacture and sell as many devices as possible before the design becomes obsolete. That goal translates into a desire to put a device into production as soon as possible and to manufacture each device in as little time as possible.

SUMMARY

In one aspect, the invention relates to an automatic test system adapted to collect a plurality of samples in a programmable window of a repetition of a repeated waveform. The automatic test system may comprise a pin electronics circuit that, in response to an event in a timing signal at a first timing input, takes a sample of a value at a signal input to the pin electronics circuit. The automatic test system also may comprise a timing circuit having an output coupled to the first timing input of the pin electronics circuit. The timing circuit may comprise a second timing input, a programmable element, and an arithmetic circuit that computes an offset based at least in part on a value stored in the programmable element. The timing circuit also may comprise an output circuit, coupled to the output, that produces a signal with an event at a time determined based on an event in a signal at the second timing input and the computed offset. The value stored in the programmable element may define a time between increments within the programmable window at which samples are collected, a number of increments within the programmable window at which samples are collected and/or a number of samples collected at each increment.

In another aspect, the invention may relate to a method of operating an automated test system to collect a plurality of samples in a programmable window of a repetition of a repeated waveform. The method may comprise receiving at least one programmed value indicating at least one of a time between increments within the programmable window at which samples are collected, a number of increments within the programmable window at which samples are collected and/or a number of samples collected at each increment within the window; and generating multiple repetitions of the repeated waveform. The method may further comprise repeatedly computing an offset applicable to a respective repetition of the multiple repetitions, the computing being based at least in part on the at least one programmed value; and in a repetition of the multiple repetitions, obtaining a sample of the repeated waveform at a time determined based at least in part on the computed offset applicable in the respective repetition.

In yet another aspect, the invention may relate to an instrument for an automated test system, the instrument adapted for collecting a plurality of samples in a programmable window of a repetition of a repeated waveform. The instrument may comprise a pin electronics circuit that samples a signal at a signal input to the instrument at a time specified by an event in a timing signal at a timing signal input, and a circuit coupled to the timing signal input, for generating the timing signal. The circuit comprising a triggering input and being configured to generate events in the timing signal corresponding to events in a signal at the triggering input. The circuit may comprise an accumulator comprising at least a first input and a clock input, the accumulator increasing an accumulated value by an amount proportional to a value at the first input in response to an event at the clock input; a first programmable register coupled to the first input of the accumulator; a second programmable register; and a counter having inputs coupled to the second programmable register and the triggering input and an output coupled to the clock input of the accumulator. The counter may be configured to output an event on the output upon counting a number of events in a signal at the triggering input, the number being dictated by a value in the second programmable register. The accumulator may be coupled to the pin electronics such that the accumulated valve defines, at least in part, the timing signal.

The foregoing is a non-limiting summary of the invention, which is defined only by the appended claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

Figure 1A:
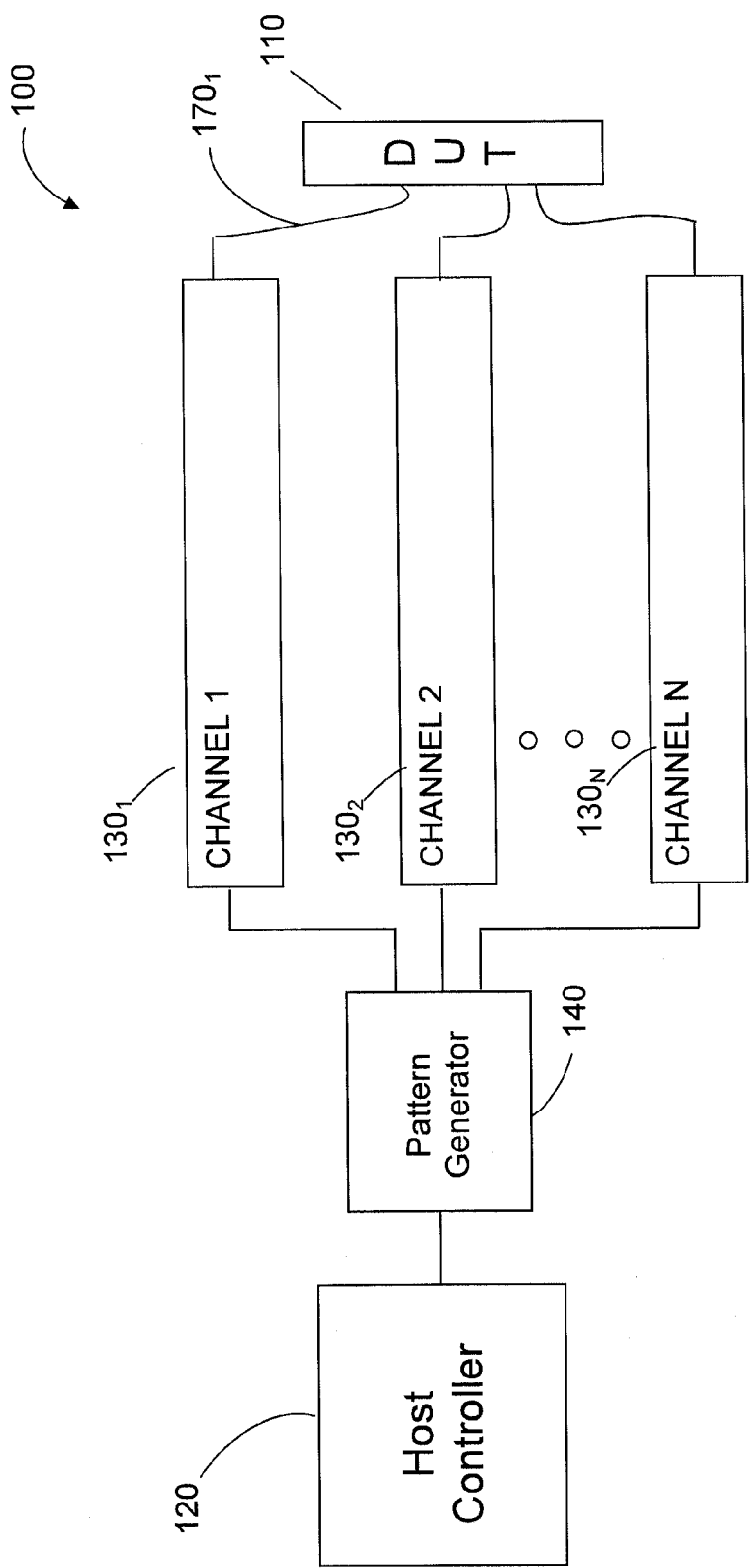
FIG. 1A is a schematic illustration of a general overview of a testing diagram of an ATE for N channels of a DUT.

The foregoing is a non-limiting summary of the invention, which is defined by the attached claims.

DETAILED DESCRIPTION

The inventor has recognized and appreciated that an improved semiconductor device tester can lead to shortened test development times and device test times. Such an improved test system, by shortening test development time, may enable a new design for a semiconductor device to be put into production sooner. By shortening device test times, a greater throughput in manufacturing semiconductor devices may be achieved. Thus, an improved tester that can be programmed more quickly and execute shorter tests can enhance the economics of developing semiconductor devices.

This enhanced value can be achieved using a tester that is designed to provide a programmable approach to detecting the timing of signal transitions in DUT outputs. Such a tester may be easy for a test engineer to program. Alternatively or additionally, the tester may reduce the time required to run a test by accepting, as part of programming defining a test, a specification of a window within a repetition of a repeated signal in which to search for the signal transition. Such a window may span only a portion of a tester cycle and may, in some embodiments, start and/or stop at times that need not be aligned with edges of a test system clock.

Known techniques of finding a signal transition include a "walking strobe." A walking strobe takes advantage of the timing precision and programmability of a tester, as well as special walking strobe hardware within the tester to control the timing of an operation. To use a walking strobe, a test program defines a loop that causes a DUT to repeatedly output a waveform in which the signal transition is to be detected. That waveform is coupled to a pin electronics circuit that is configured to compare the signal output by the DUT to a level that indicates whether the signal level is above or below a level to indicate that the signal transition has occurred.

The walking strobe hardware may adjust the timing at which that comparison operation is performed for each repetition of the repeated waveform. In the first repetition, the hardware generates a strobe such that the comparison is made at the start of the tester cycle coincident with the start of a repetition of the repeated waveform. In each successive repetition, the walking strobe hardware times the comparison so that it is made a small increment in time later than in the prior repetition. The repetitions of the waveform continue until the comparison has been made at time increments across the entire waveform. In this way, the "strobe" time at which a measurement is made "walks" across the waveform.

If multiple samples at each increment are desired, for example to provide averaging to reduce the effects of noise, more iterations may be performed to walk the strobe across the waveform again. Once a desired number of iterations are performed, the results of the comparisons may be analyzed to detect comparisons at adjacent times (relative to the start of the tester cycle) at which the waveform was measured with a value indicating, at one increment, that the signal transition had not occurred, and, at the next adjacent increment, that the signal transition had occurred.

The inventors have recognized and appreciated that, though a walking strobe advantageously uses the high speed and highly accurate pin electronics in a test system, a walking strobe may lead to test times that are unnecessarily long. The inventor has recognized and appreciated that a test engineer may have information that can be used to define a window during a tester cycle in which a signal transition is likely to occur. Moreover, if a DUT does not produce an output with a signal transition in that window, the DUT may be deemed defective regardless of when that signal transition occurs. Thus, continuing to walk a strobe across an entire repetition of a waveform may be avoided.

According to some embodiments, a tester may be programmable to find a signal transition in a more focused way, thus increasing the speed at which the tester can test devices. Finding a signal transition more quickly may involve a data sampling method that is programmable for a particular test. To support a programmable approach, a tester may include a programmable strobing circuit that can be programmed with user-specified parameters to customize the timing of strobes in each of multiple repetitions of a repeated waveform. The hardware may include programmable elements that receive parameters specifying actions in making repeated comparisons at increments within a window in time that spans only a portion of the repetition of a repeated waveform. That window, for example, may even span only some of the tester cycles in a repetition of the waveform or even a portion of a tester cycle, thereby reducing the time to complete a test relative to a conventional walking strobe measurement.

By allowing a signal transition to be detected by specifying parameters of the window in which the test system will search for the signal transition, a test engineer may simply program the test system to perform the desired operation. The programmable parameters may include a time between increments within of the programmable window at which samples are collected, a number of increments within the programmable window at which samples are collected and/or a number of samples collected at each increment. Though, other parameters may alternatively or additionally be programmed.

According to some embodiments, the strobing circuit may be implemented using technology of the type used to implement conventional timing circuitry within an automated test system. However, it should be appreciated that any suitable technology may be used to implement the strobing circuit.

It should also be appreciated that a strobing circuit for faster programming may be implemented in any suitable test system. A test system in which the strobing circuit may be implemented is illustrated in FIG. 1. However, it should be appreciated that the test system of FIG. 1 is for illustration and not a limitation on the scope of the invention.

FIG. 1A illustrates a tester 100 that may be programmed to cause a DUT 110 to output multiple repetitions of a waveform. In the embodiment illustrated, each repetition is created by providing the same stimulus signals to excite a circuit response from the DUT 110. The host controller 120 directs the pattern generator 140 to provide this stimulus.

Host controller 120 may be implemented in any suitable way, including using techniques as are conventionally used in constructing a controller for an automated test system. Controller 120 may be implemented using a computer workstation or other computerized device. Accordingly, controller 120 may provide a user interface, run programs or computerized tools and/or allow an interface to pattern generator 140 or other components within tester 100.

Through the interface provided by a host controller 120, programs within test system 100 may be controlled and/or programmed. Similarly, results can be retrieved from those components and presented to a user or analyzed to generate outputs or to determine control actions for other elements of tester 100. In executing a test to determine the timing of a signal transition in an output produced by DUT 110, host controller 120 may configure circuitry within tester 100 to repeatedly generate a waveform, compare a response from DUT 110 to signal levels representing a transition in the waveform, and store the results of those comparisons in a way that can be later accessed. Host controller 120 may access the results of those comparisons and perform analysis on them to indicate the time within the waveform that the transition was detected or take other desired actions in response to measuring the time of the signal transition.

In addition, host controller 120 may configure a strobing circuit to vary the timing of those comparisons for different repetitions of the waveform such that comparisons are made across a specified window. That window may be specified based on parameters specified by a test engineer and incorporated into a test program or obtained from any other suitable source.

Pattern generator 140 may be implemented in any suitable way, including using techniques as are conventionally used in constructing a pattern generator for an automated test system. In some embodiments, for example, pattern generator 140 may be constructed with digital logic circuitry and digital storage circuitry that stores data and control information written by host controller 120 or any other suitable source.

Pattern generator 140 may be programmed with multiple parameters that control the generation and measurement of test signals. Some portion of the pattern may define operation of each of multiple channels, of which channels $130_1$-$130_N$ are illustrated in FIG. 1A. Each channel may, in each test cycle, perform a programmed operation that generates or measures a test signal at DUT 110.

As shown, each of the channels $130_1$-$130_N$ is coupled to a test point on DUT 110 via a signal interface path, of which interface path 170₁ is numbered. Accordingly, a portion of the channels $130_1$-$130_N$ may be controlled, based on the programming of pattern generator 140, to generate a stimulus coupled to DUT 110 that causes DUT 110 to produce a repetition of the waveform or waveforms on which a measurement is to be performed.

One or more of the channels $130_1$-$130_N$ may be coupled to a test point on DUT 110 where that waveform is produced. These channels may include a strobing circuit that controls the time at which a comparison is made of the signal level of that waveform to a programmed value indicative of a signal transition. Such a strobing circuit may control the time so that, in different repetitions of the waveform, the comparison is made at different times. Nonetheless, these comparisons may be limited to a window, representing a portion of the waveform.

In addition, an overall test flow may be programmed in tester 100, based on the programming in host controller 120 and/or programming in pattern generator 140. The overall test flow may include various steps in a testing process. These steps, for example, may include generating stimulus signals to DUT 110 to place it in a state in which it will generate the waveform to be measured.

The overall test flow may also specify a loop over a portion of a test pattern programmed into pattern generator 140 that generates stimulus signals to cause DUT 110 to generate a repetition of the waveform. Further, the overall test flow may configure tester 100 such that, during each iteration of this loop, a sample of the waveform is taken at a time specified by a current sample time computed by the strobing circuit.

Figure 1B:
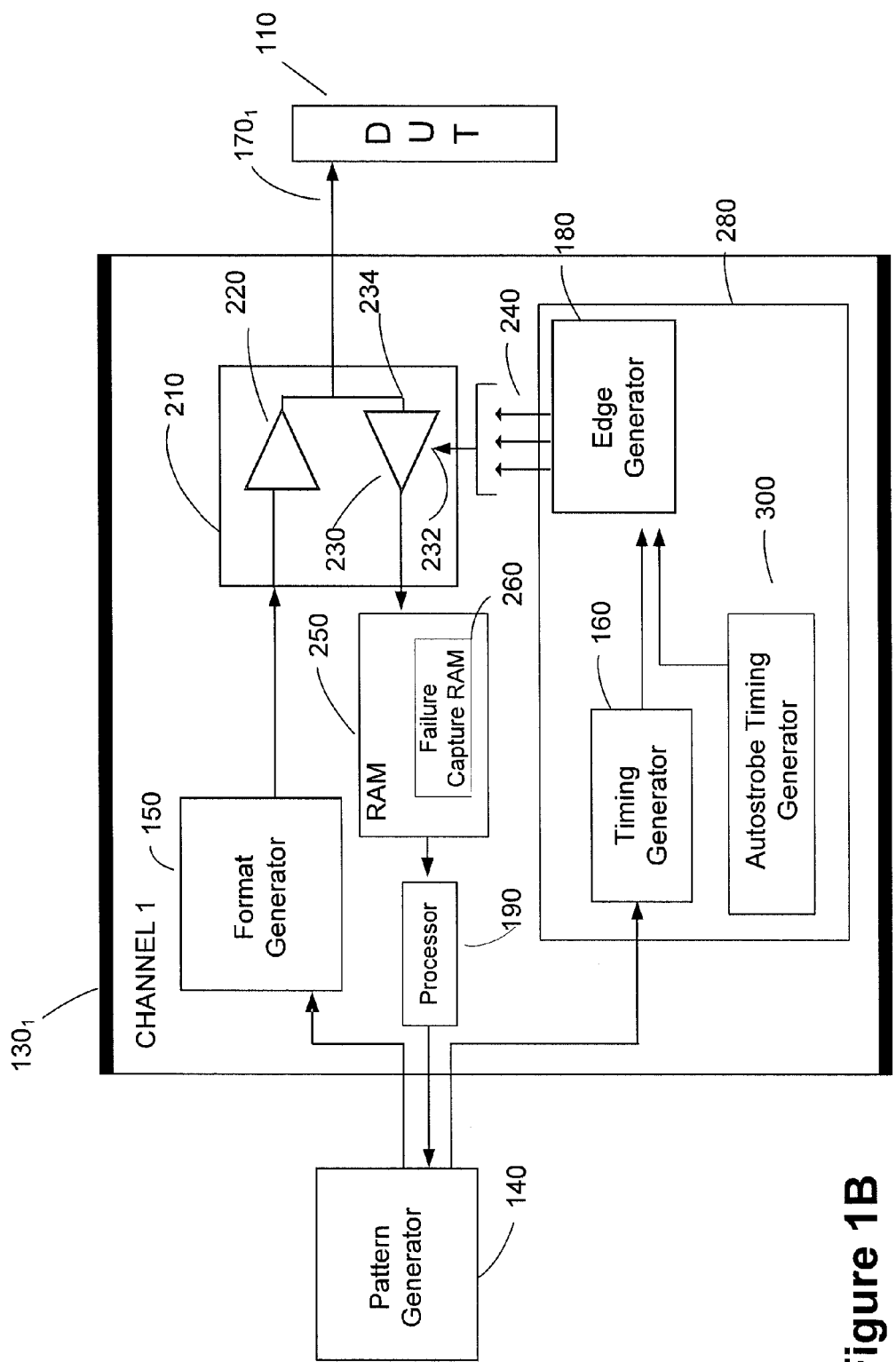
FIG. 1B is a schematic illustration of one channel of the test system of FIG. 1A.

The channel as illustrated in FIG. 1A may be implemented in any suitable way, including using components as are conventionally used in the manufacture of automated test systems. In some embodiments, all of the channels $130_1$-$130_N$ may have the same construction. In other embodiments, different channels may be configured for different test functions. FIG. 1B illustrates one channel, $130_1$, of the tester in greater detail, including on autostrobe timing generator 300, which serves as a strobing circuit. Such a channel may be incorporated within a digital instrument of a type conventionally installed in automated test systems. Alternatively or additionally, such a channel may be implemented in a stand-alone instrument designed for installation in an automated test system.

In this example, channel $130_1$ contains circuitry that can be controlled to generate and/or measure signals at a test point on DUT 110. In addition to autostrobe timing generator 300, channel $130_1$ contains circuitry that may conventionally exist in a channel circuit. That circuitry includes pin electronics circuit 210, which includes a driver 220 and a comparator 230. In each cycle of tester operation, pin electronics 210 may be controlled to generate a signal via driver 220 or measure a signal via comparator 230.

The specific signal pattern generated by driver 220 in any test cycle may depend on a value programmed into pattern generator 140 and programming of format generator 150. As in a conventional test system, data from pattern generator 140 and format generator 150 may specify a sequence of transitions defining a signal to be produced by driver 220.

Timing circuit 280 may control the timing of these transitions in the output. Timing circuit 280 outputs timing signals 240. Each transition may occur in response to one of the timing signals 240, sometimes called an "edge", output by edge generator 180. As in a conventional test system, the time at which the edges are generated, when channel $130_1$ is being used to generate a stimulus signal, may be controlled by timing generator 160. A combination of values programmed into timing generator 160 and pattern generator 140 may specify, for each tester cycle, the timing of edges that will control operation of pin electronics 210. In some embodiments, timing generator 160 may output timing specifications as digital values, each representing a time relative to the start of a cycle of tester operation. Edge generator 180 may convert the timing specifications into analog timing signals that are the "edges."

FIG. 1B also illustrates circuitry that may be active when channel $130_1$ is used to measure a response from DUT 110. The circuit response of the DUT 110 is received at the pin electronics circuit 210 via line $170_1$. This response is the input signal 234 to the comparator 230. Comparator 230 may be programmed with values that define one or more levels and comparator 230 may output an indication, at a specified measurement time, of the level of input signal 234 relative to the programmed levels. Depending on the configuration of comparator 230, the comparisons may indicate that the measured level is above a programmed level, below the program level or between two program levels. Though, it should be appreciated that any suitable comparison may be made.

In a test cycle in which channel $130_1$ is configured to make a measurement, the specified measurement time may be controlled by one or more of the timing signals 240 from timing circuit 280. In this case, a timing signal is coupled to the timing input 232 of comparator 230 and triggers the comparator to compare the input signal 234 to one or more programmed values. Timing signals 240 used to control a comparator are sometimes called strobes. As with timing signals that control driver 220, strobes are generated by the edge generator 180 which works in conjunction with the timing generator 160 and pattern generator 140.

This comparison acts as a sample of the output of DUT 110, by indicating whether the input signal 234 is above or below one or more thresholds. This sample may then be stored and/or processed. In the embodiment illustrated, sample values are stored in the RAM 250. In some embodiments, every sample may be stored in RAM 250. In other embodiments, only a portion of the samples may be stored.

The information stored in response to a comparison may depend, for example, on the results of the comparison. Some test systems may be configured to compare an input signal 234 to an expected value. An indication of the comparison, including information indicating the time at which the comparison was performed, may be recorded in failure capture RAM 260 only in circumstances in which the input signal deviates from the expected value or only in circumstances in which the input signal has the expected value.

Regardless of the format in which samples are stored, the samples may be further processed to glean information about operation of DUT 110. For example, a channel may include processor 190, which can detect specific levels or patterns output by DUT 110 and may be, for example, a failure processor. Alternatively or additionally, failure processor 190 may control aspects of a test, such as conditional processing or test operations, based on the sample values.

Channel 1 illustrated in FIG. 1B may alternatively be configured to collect samples in a window of a repeated waveform, which can be analyzed to detect a transition in that waveform. To support this function, a strobing circuit, here illustrated as including autostrobe timing generator 300, may be enabled. Other strobe timing generators, like conventional timing generator 160, may output specifications for the times at which edge generator 180 outputs one or more timing signals 240. In the illustrated embodiments, the timing specifications generated by autostrobe timing generator 300 may indicate the time at which one or more strobes, triggering operation of comparator 230, is to be generated.

These timing specifications may be synchronized with a portion of a pattern executed in a loop, that controls other channels within tester 100 to generate a stimulus signals that causes DUT 110 to output a repetition of a waveform for which a signal transition is to be to be detected. Synchronization may be achieved by a control signal applied to autostrobe timing generator 300 that may be generated in any suitable way. For example, such a control signal may be generated by a pattern generator 140 synchronous with each loop through the portion of the pattern. Alternatively or additionally any other suitable component within test system 100 may generate a control signal that is applied to both autostrobe timing generator 300 and pattern generator 140 to trigger these components to operate synchronously. Such a control signal is illustrated as wave tool signal 292 in FIG. 1C. However, any suitable mechanism may be used to coordinate the generation of a stimulus signal that causes DUT 110 to generate a waveform to be measured and operation of autostrobe timing generator 300 that controls the timing of those measurements.

The timing specifications generated by autostrobe timing generator 300 may be different for each iteration through the pattern loop causing a further repetition of the waveform to be measured to be generated. To achieve this functionality, autostrobe timing generator 300 may include arithmetic circuitry that computes a current sample time for each iteration through the loop. That current sample time may be applied to an output circuit that converts the current sample time into inputs to edge generator 180, which in turn generates a strobe at an appropriate time.

Figure 1C:
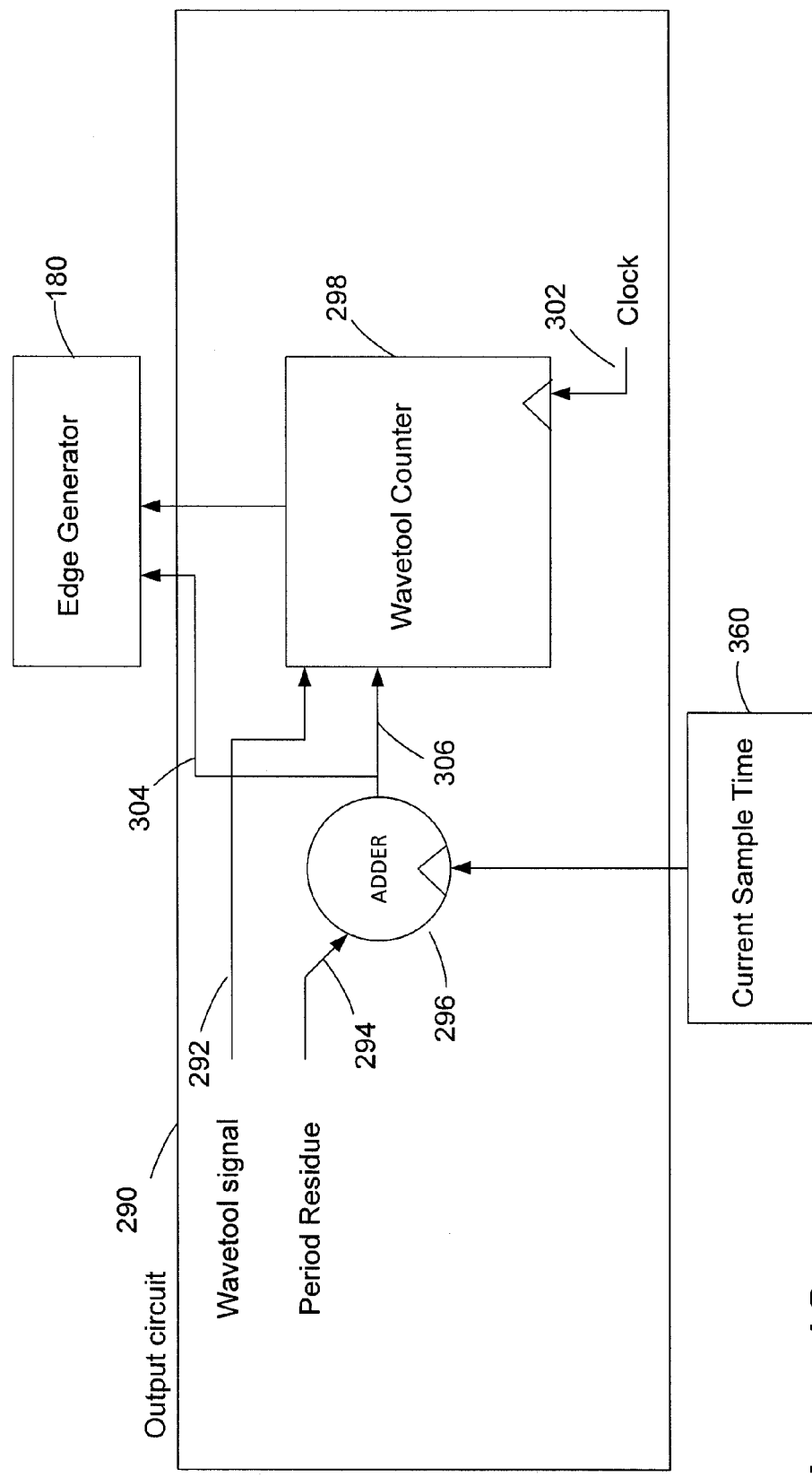
FIG. 1C is a schematic illustration of an output portion of a strobing circuit that may be integrated into a channel as illustrated in FIG. 1B.

FIG. 1C illustrates an exemplary output circuit 290 for autostrobe timing generator 300. In the example illustrated, test system is clocked by a clock 302 that controls timing of operation of digital components within tester 100. For example, each test cycle may be defined as some number of cycles of clock 302. The current sample time 360 may be defined as some number of cycles of clock 302 following a edge of wavetool signal 292. Accordingly, an approach to determining a time of a strobe at current sample time 360 may be to count a number of cycles of clock 302 following a transition in wavetool signal 292. Any suitable circuitry may be used to track the passage of a number of cycles of clock 302 that depends on the value of the current sample time 360.

Counter 298 provides an example of suitable circuitry for this purpose. The value of the current sample time 360 may be loaded into counter 298. Counter 298 may be triggered to count down in response to a change in state in wavetool signal 292 that is recognized as wavetool signal 292 "firing." Any suitable change in a signal, such as an edge or polarity reversal may be interpreted as that signal "firing," and the specific format of the signal change that is interpreted as "firing" may depend on the nature of signal changes to which the illustrated circuit components respond, and is not critical to the invention.

As illustrated, counter 298 is clocked by counter 302 such that it will decrement once each cycle of clock 302. After a time equal to a number of periods of clock 302 specified by the current sample time 360 loaded into counter 298, counter 298 will count down to zero and output a signal. This signal may serve as an enable input to edge generator 180, indicating to edge generator 180 to generate a strobe, which will occur at the specified time following the firing of wavetool signal 292.

Counter 298 alone may be adequate in embodiments in which events within a test system are timed with a resolution equal to the resolution of clock 302. However, in some test systems, events may be timed with a finer resolution than a period of clock 302. Accordingly, one or more timing adjustments relative to times determined by a period of clock 302 may be used in a tester. Current sample time 360 may specify a time that includes some number of periods of clock 302 plus a residue. The number of periods of clock 302 may be represented by the higher order bits 306 of current sample time 360, which may be loaded into counter 298. The residue, representing a timing offset smaller than the period of clock 302, may be represented by the lower order bits 304 of current sample times 360.

In a conventional test system, an edge generator may generate a strobe at a time that is delayed relative to an enable signal by a programmable amount. The residue, represented by the lower order bits 304 of the current sample time 360, may be applied as an input to edge generator 180 to specify a delay following receipt of an enable signal. Edge generator 180 may include an analog circuit, sometimes called a timing vernier, that produces a pulse or other signal transition to provide a programmable delay following the enable signal. The vernier, because it is an analog circuit, is not limited to measuring delay in terms of periods of a clock, and may have a very fine timing resolution, such as less than 2 psec. Accordingly, the output of counter 298 may be coupled to edge generator 180 to provide that enable signal at a time that is determined based on periods of clock 302 and the low order bits 304 may be coupled to edge generator 180 to provide the programmable delay that is less than a period of clock 302.

In some embodiments, one or more timing adjustments may be applied to the current sample time 360 that is used to determine the time of a strobe generated by edge generator 180. Accordingly, FIG. 1C illustrates that current sample time 360 is adjusted in adder 296 before the higher order bits 306 are loaded into counter 298 and the lower order bits 304 are provided to edge generator 180. Any suitable timing adjustments, determined in any suitable way, may be input into adder 296. These timing adjustments, for example, may represent calibration values that, for example may represent an offset between the firing of wavetool signal 292 and the time at which a waveform to be measured is generated by a DUT.

The specific timing adjustments, if any, incorporated through adder 296 are not critical to the method of collecting samples in a window of a repeated waveform, as described herein. However, in the specific example of FIG. 1C, an adjustment is input to adder 296 to reflect timing of test cycles that are not integral multiples of clock 302. Accordingly, though wavetool signal 292 may have signal transitions that align with clock 302, those transitions may not align with the start of a test cycle. The difference may be represented by a period residue 294. This period residue may change from tester cycle to tester cycle and may be computed by timing circuitry within tester 100. Such timing circuitry may be implemented as in a conventional tester, and is not shown in FIG. 1C for simplicity.

Figure 1D:
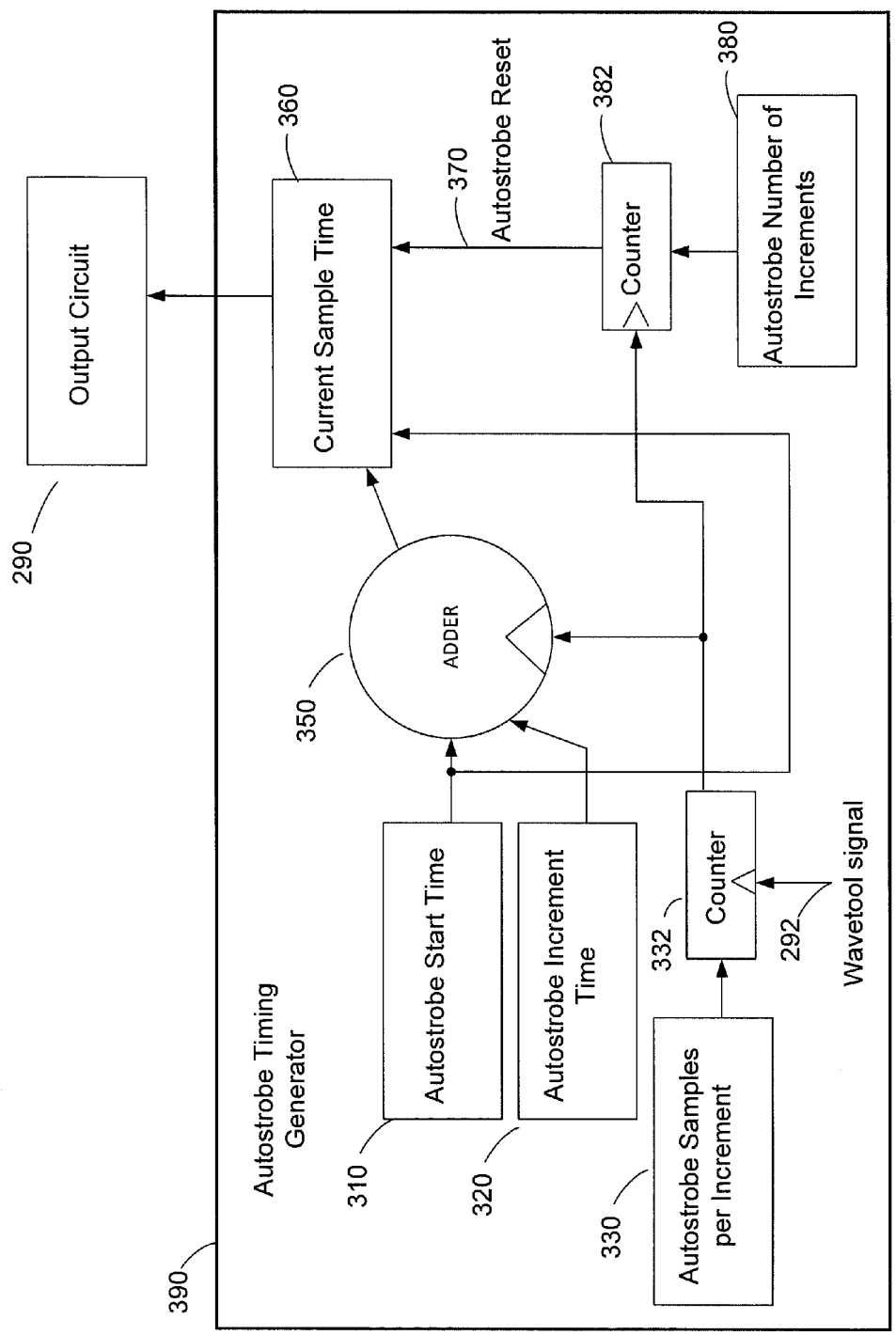
FIG. 1D is a schematic illustration of a sample time computation portion of a strobing circuit that may be used with the output portion illustrated in FIG. 1C.

FIG. 1D illustrates an arithmetic circuit 390 that computes a current sample time for each iteration through a loop in which a stimulus signal is applied to a DUT, causing the DUT to generate a repetition of the waveform for which a transition is to be measured. The current sample time 360, for each iteration, may be computed based on user input that is stored in programmable elements of the arithmetic portion 300. These programmable elements may be registers or other suitable memory locations. The programmable elements may be loaded in any suitable way, including by host controller 120 as described above, or in any other suitable way.

Programmable element 310 may be programmed with an autostrobe start time. A user may specify the autostrobe start time to define the beginning, relative to the firing of the wavetool signal, of a window in which a transition in the waveform being measured will be detected. This testing window can be set by the user to finely tune the portion of the waveform that is sampled by the tester to detect a signal transition. The capability of specifying a window can lead to a more efficient tester since it reduces the amount of time it takes to find the signal transition.

As another example, programmable element 320 may store an autostrobe increment time 320. The increment time may define the spacing between times at which samples are taken. In operation, the current sample time 360 may increase by amounts equal to the increment time when sampling is completed at one increment.

As another example, a programmable element 330 may store an autostrobe samples per increment value. A user can define the number of samples taken at each increment. Taking multiple samples per increment may allow, for example the more accurate measurements through averaging out noise. However, more samples per increment may lead to a longer testing process. By providing a programmable element to hold this value, a user may program a tradeoff between more accuracy and longer test time.

Additionally, a programmed value may specify the duration of the window over which samples are taken. In the example of FIG. 1D, the end of the window is specified by a value in programmable element 380. In this example, programmable element 380 stores the number of increments per window. However, the end of the window may be specified in any suitable way, such as by specifying an ending time. Moreover, it is not a requirement that the window have a deterministic size. In some embodiments, the end of the window may be determined dynamically based on a result of a comparison of a measured value or values that specify an ending condition.

In the embodiment illustrated, arithmetic circuit 390 may use these, and any other suitable programmed values, to compute the current sample time 360 for each sample to be taken. The current sample time 360, for the first iteration through a loop of a test pattern that generates a repetition of the waveform to be measured, may reflect the start of a programmed window. In subsequent iterations, in which subsequent repetitions of the waveform are generated, the current sample time 360 may stay the same until the programmed number of samples per iteration has been taken. The current sample time 360 may then increase by the programmed increment time.

The current sample time 360 may again stay the same until the programmed number of samples per iteration has been taken. This process of increasing the current sample time 360, taking a number of samples at the new current sample time 360 and then again increasing the current sample time 360, may be repeated until the number of increments per window is reached.

FIG. 1D illustrates arithmetic circuitry that may compute the current sample time 360 based on these programmed values. That circuitry may be initialized with programmed values in programmable elements, such as programmable elements 310, 320, 330, and 380. Some of these values may be supplied to other circuit components as part of a computation of the current sample time 360. For example, the value stored in programmable element 330, representing the number of samples to be taken per increment, may be loaded into counter 332. Likewise, the value in programmable element 380, representing the number of increments in the window, may be loaded into counter 382. Further, the value in programmable element 310, representing a start time for the window, may be loaded into register 360.

In the example of FIG. 1D, register 360, in combination with adder 350, implement an accumulator. Loading register 360 with the value in programmable element 310 has the effect of initializing the accumulator with a first sample time corresponding to the start of the program window. Each time the signal at the clock input to adder 350 is asserted, adder 350 will add to the value in register 360 the value stored in programmable element 320. Because programmable element 320 stores the programmed increment time, each time the clock input to adder 350 is asserted, the current sample time is increased by the programmed increment.

In the embodiment illustrated, the current sample time 360 increases by the increment time 320 after a specified number of samples have been taken at one increment. To achieve this result, adder 350 is clocked by the output of counter 332. Counter 332 is configured to assert an output signal after counting a number of samples equal to the programmed number of samples per increment. This result is achieved by loading counter 332 with the value in the programmable element 330 and clocking counter 332 with wave tool signal 292. In this example, counter 332 will count down, each time a sample is taken, from the specified number of samples per increment. When counter 332 reaches zero, indicating the programmed number of samples per increment has been taken, counter 332 asserts its output. When the output of counter 332 is asserted, counter 332 resets itself, reloading the value from programmable element 330.

In this way, an assertion of the output a counter 332 signals that the programmed number of samples per increment has been taken. In addition to clocking adder 350, which increases the value in register 360 representing the current sample time, assertion of the output of counter 332 clocks counter 382.

In the example of FIG. 1D, counter 382 is configured to track whether samples have been collected at a programmed number of increments. By tracking the number of increments for which samples have been collected, counter 382 may track whether the end of the programmed window has been reached. Counter 382 may perform this function because it is initially loaded from programmable element 380 with the programmed value of the number of increments in the window. Each time counter 332 asserts its output, signifying that the programmed number of samples have been collected for one increment, counter 382 counts down. When counter 382 counts down to zero, it may assert its output, signifying that the programmed number of increments has been reached.

In the example of FIG. 1D, the output of counter 382 serves as a reset signal 370 for arithmetic circuit 390. One or more circuit elements, both inside and outside arithmetic circuit 390, may respond to reset signal 370. For example, the value in register 360 may be reset to the window start time in response to reset signal 370. Other responses to reset signal 370 being asserted may include stopping the loop within pattern generator 140 that provides a stimulus to a DUT and triggering the waveform to be measured. Alternatively or additionally, assertion of reset signal 370 may trigger analysis of sample values captured during execution of that loop.

Figure 2:
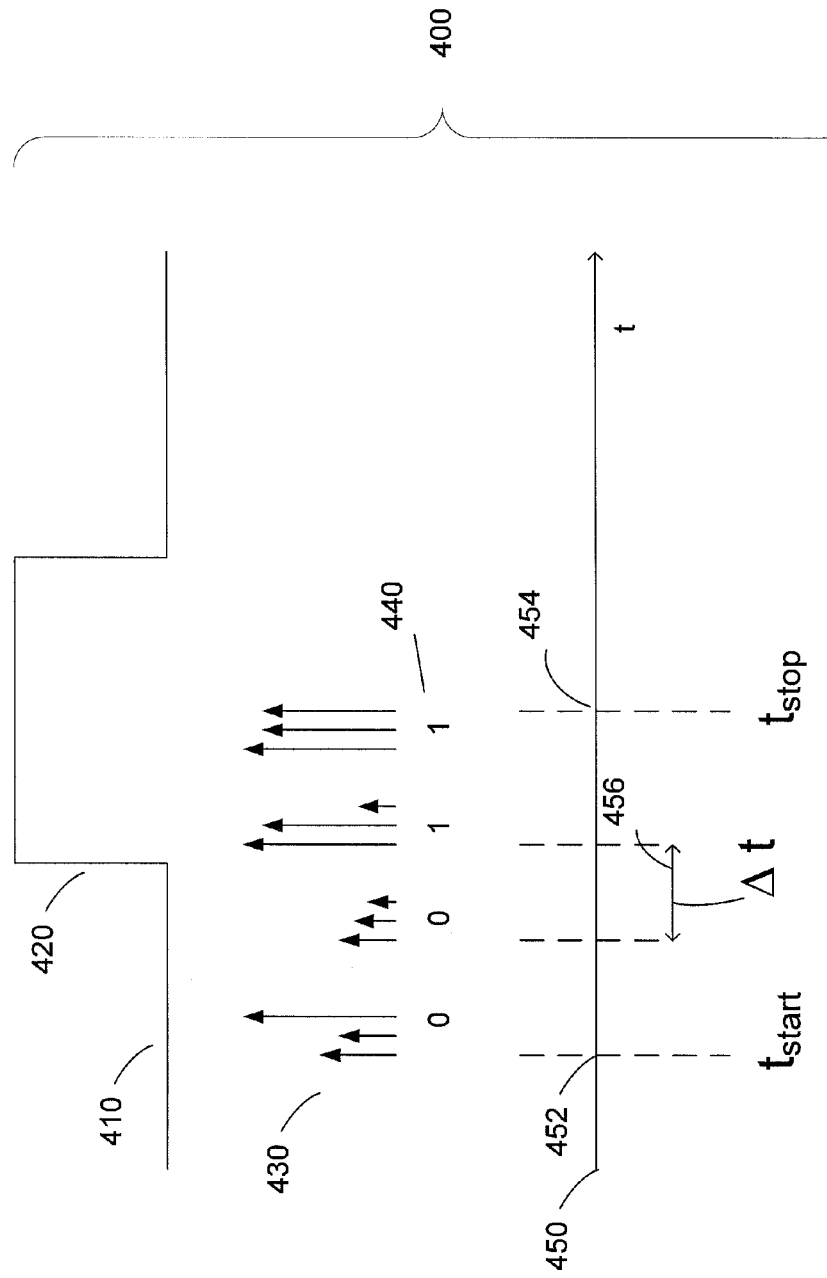
FIG. 2 is a timing diagram that demonstrates programmable sampling parameters that may be set to measure a signal transition in a waveform such as may occur when testing a response from a DUT.

FIG. 2 is a timing diagram 400 illustrating operation of the circuitry as described above. Waveform 410, in this example, represents a repetition of a waveform output by a DUT. In this case, waveform 410 includes a signal transition 420. Circuitry within a tester may be programmed to make multiple measurements of the level of waveform 410 within a window.

In the example of FIG. 2, the window occurs between tstart 452 and tstop 454. These times may be defined relative to a start of a repetition of waveform 410 at a time 450. In the embodiment illustrated in FIGS. 1C and 1D, the time 450 may be indicated by assertion of wave tool signal 292. However, it should be appreciated that the timing of events may be signaled in any suitable way.

FIG. 2 illustrates that within the window between times 452 and 454, samples are taken at multiple increments, of which increment 456 is numbered. In this example, each increment is separated in time from other increments by an amount Δt.

As illustrated by the sample sets, of which a sample set 410 is numbered, multiple samples are taken at each increment. In this example, three samples are shown per increment. However, it should be appreciated that any suitable number of samples may be taken per increment.

FIG. 2 shows samples taken for multiple repetitions of waveform 410 overlaid on a common time axis. It should be appreciated, however, that for the autostrobe circuitry described in connection with FIGS. 1C and 1D, one sample is collected per repetition of the waveform. These samples, though collected separately, may be related to a common time axis because each repetition of the waveform starts at a time 450. The time of each sample, therefore, may be expressed as an offset from the starting time 450 for that repetition.

Samples may be impacted by noise such that, though the value of the samples at each increment should be the same, there may be differences among the samples in a set of samples taken at one increment. For example, the first set 430 shows two samples with a value of LO and one sample with a value of HI. On average, these samples indicate a value of LO at the first increment. At the second increment, all three samples have a value of LO, which may be deemed the value for the second increment. At the third and fourth increments, the three samples have an average value of HI. Accordingly, the stored values 440 of the samples may be 0, 0, 1, 1. This pattern indicates that signal transition 420 occurred between the second and third increments. In this way, the timing of signal transition 420 may be determined.

Figure 3:
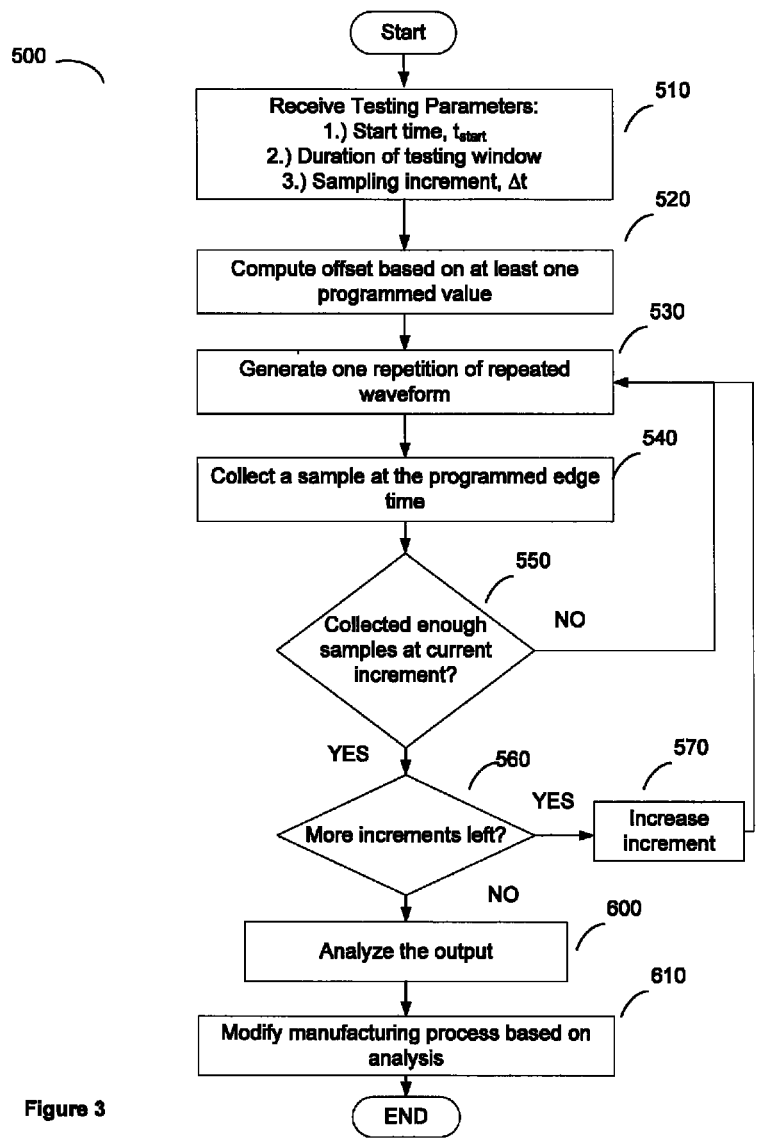
FIG. 3 is a flow chart of a method or operation of a test system in accordance with some embodiments of a testing technique as described herein.

FIG. 3 illustrates a method 500 of operation of a test system configured to quickly and flexibly identify the time of a signal transition in a waveform. All, or in some embodiments, a portion, of the acts illustrated in FIG. 3 may be performed by operation of circuitry within a tester or other computerized devices coupled to a tester. At block 510 the test system may receive from the user testing parameters such as a start time of the testing window, duration of the testing window, and/or the sampling increment.

Additionally, pin electronics in a channel used for determining the timing of a signal transition may be configured based on the specific signal transition to be detected. Values specifying the configuration of the pin electronics may also be received from the user at block 510. For example, when the signal transition to be detected is a rising edge represented by a change in voltage from less than 0.2 V to above 0.8 V, a comparator in the pin electronics may be programmed to produce an output distinguishing between a 0.2 V and 0.8 V signal. Such a configuration may be achieved, for example, by programming the comparator to recognize a LO signal as 0.2 V or less and a HI signal as 0.8 V or higher. A comparator configured in this way may generate an output from which it can be inferred whether the signal transition has occurred.

Such output may be represented in any suitable way. In some embodiments, the output may indicate whether the comparator detected a LO or HI signal. In other embodiments, the channel may be programmed with an expected value, such as a LO, and the output of the comparator may be represented as an indication of whether the comparator detected that expected value. Configuring the comparator in this way may result in an output indicating a "failure" after the signal transition occurred. Such an approach may be used, for example, in combination with a failure capture RAM 260 (FIG. 1B) to reduce the amount of data stored during multiple iterations of a loop in a test pattern. However, any suitable configuration may be used, and subsequent processing of the data collected may be dependent on the representation of a signal level with or without the transition in the waveform occurring.

Further configuration parameters alternatively or additionally may be received. For example, configuration parameters may indicate a configuration of the test system, such as which channels are used to generate a stimulus signal and which channel or channels are used to measure the response. Other configuration parameters may define the test pattern executed to stimulate the DUT.

The configuration values may be received by tester hardware in any suitable way. In some embodiments, a host controller 120 may control loading of programmable elements within tester 100 to achieve the desired configuration. However, the specific approach by which configuration occurs is not critical to the invention.

Regardless of the specific approach by which configuration occurs, the testing parameters may be used to compute an initial current sampling time in block 520. The current sampling time may be computed as an offset from the firing of a signal or other event that signals an iteration through a loop in which a repetition of a waveform is generated.

The tester may then operate to generate one repetition of a waveform at block 530. This waveform may be generated by applying to a DUT a stimulus that provokes the DUT to respond with the waveform. Accordingly, processing at block 530 may be performed by execution of a portion of a pattern that controls one or more channels of the tester to generate that stimulus. However, it should be appreciated that timing of a signal transition in any suitable signal may be determined using the techniques described herein.

In block 540, a sample of the waveform is taken at the current sample time computed at block 520. A sample may be collected by configuring an edge generator within a tester channel to generate a strobe for a comparator at a time indicated by the current sample time. The strobe may cause a comparator coupled to the DUT output carrying the waveform to be tested to compare the output signal against a programmed level stored in the comparator and produce a sample indicating a result of that comparison. This sample may be stored in a failure capture memory or in any other suitable way.

Processing then proceeds to decision block 550 where a determination is made whether enough samples have been collected at the current increment. This comparison may be based on the testing parameters received at block 510, which may include a parameter specifying a number of samples per increment. If enough samples have been collected, processing may branch from decision block 550 to decision block 560.

Otherwise, further repetitions of the waveform will be generated and further samples will be taken. Accordingly, if enough samples have not been collected, processing may loop back from decision block 550 to block 530. Repeating processing from block 530 results in the DUT being stimulated to again generate a repetition of the waveform, which can be sampled as indicated at block 540.

When, as determined by processing at decision block 550, enough samples have been taken for a current increment, processing branches to decision block 560. Processing at decision block 560 determines whether samples have been taken across a window specified by the testing parameters received at block 510. If not, and there is still another increment in that window, processing may branch to block 570 where a new current sample time, reflecting the next increment within the window, is computed.

From block 570, processing loops back to block 530 where a further repetition of the waveform is generated. At block 540, the sample time is collected at the new current sample time.

The process of generating a waveform and taking samples at changing times relative to the start of each repetition of the waveform may be repeated until a programmed number of samples have been taken. The programmed number may be based on one or more testing parameters programmed into the circuitry performing the method 500, including a width of a window, a size of an increment between sample times and a number of samples for each increment.

When enough samples have been collected, processing will proceed to block 600. At block 600, the samples may be processed to detect a time of a signal transition in the waveform. This processing may be performed by circuitry within a tester, in a work station coupled to the tester or in any other suitable computer processing equipment that can directly or indirectly access the collected samples. Such processing may additionally determine if the DUT performed according to a device specification or otherwise exhibited an expected or out-of-specification response to the stimulus.

The results of the analysis at block 600 may be used in any suitable way. In some embodiments, the result may be displayed to a test engineer. In other embodiments, the result may be used alone or in combination with other test results collected by a tester to make a determination of the result of testing a specific DUT as part of a manufacturing process. The results may indicate a level of performance of the DUT, such as that the DUT is performing fully according to specification, is not performing according to specification but might be modified in some way to improve its performance, is not performing sufficiently to be usable or is performing in only some respects, but those respects are adequate for the DUT to be usable in some scenarios.

In an embodiment in which results of the analysis at block 600 are used in a manufacturing operation, processing may proceed to block 610. At block 610 the manufacturing process may be modified based on the analysis performed at block 600. This processing may be performed in a fully automated manner in a test cell controller, factory controller or other suitable computerized device. Alternatively or additionally, processing at block 610 may be partially or fully done manually. For example, when results of analysis indicate that a specific DUT is fully operational, faulty or is faulty but could be repaired, processing at block 610 may be fully automated and performed by an exchange of commands and/or data between computerized devices that routes the specific DUT to the appropriate next stage in the manufacturing operation. Alternatively or additionally, the results of the analysis may be presented to a human who detects trends across multiple devices and adjusts one or more steps in the process of manufacturing of semiconductor devices being tested.

Having described embodiments of the invention in detail, various modifications and improvements will readily occur to those skilled in the art.

For example, it was described in conjunction with FIG. 1D that counter 382 determines when the end of a window is reached. Such a determination may be made within arithmetic circuit 390 or in any other circuitry within tester 100. For example, pattern generator 140 may output a reset signal, indicating the end of the window has been reached. Alternatively or additionally, the collection of samples may stop at the end of the window if the pattern generator 140 or other circuitry generating wavetool signal 292 stops asserting that wave tool signal.

Further, it should be appreciated that the specific circuitry to implement the methods above may be implemented in any suitable way. The various methods or processes outlined herein may be implemented in any suitable hardware, such as one or more processors, Field Programmable Gate Arrays (FPGAs) or Application Specific Integrated Circuits (ASICs). Data structures, including buffers, may be stored in non-transitory computer-readable storage media in any suitable form, and/or may comprise digital circuitry.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

Use of ordinal terms such as "first," "second," "third," etc., in the claims to modify a claim element does not by itself connote any priority, precedence, or order of one claim element over another or the temporal order in which acts of a method are performed. Such terms are used merely as labels to distinguish one claim element having a certain name from another element having a same name (but for use of the ordinal term).

The phraseology and terminology used herein is for the purpose of description and should not be regarded as limiting. The use of "including," "comprising," "having," "containing", "involving", and variations thereof, is meant to encompass the items listed thereafter and additional items.

Such modifications and improvements are intended to be within the spirit and scope of the invention. Accordingly, the foregoing description is by way of example only, and is not intended as limiting. The invention is limited only as defined by the following claims and the equivalents thereto.

What is claimed is:

1. An automatic test system configured to collect a plurality of samples in a programmable window of a repetition of a repeated waveform, the automatic test system comprising:
   a pin electronics circuit that, in response to an event in a timing signal at a first timing input, takes a sample of a value at a signal input to the pin electronics circuit; and
   a timing circuit having an output coupled to the first timing input of the pin electronics circuit, the timing circuit comprising:
      a second timing input;
      a programmable element;
      an arithmetic circuit that computes an offset based at least in part on a value stored in the programmable element; and
      an output circuit, coupled to the output, that produces a signal with an event at a time determined based on an event in a signal at the second timing input and the computed offset,
      wherein the value stored in the programmable element defines a number of increments within the programmable window at which samples are collected and/or a number of samples collected at each increment.

2. The automatic test system of claim 1, wherein:
   the timing circuit comprises a counter coupled to the programmable element and the second timing input, the counter generating an event based on counting a number of events in the signal at the second timing input, wherein the number of events is specified by the value stored in the programmable element; and
   the arithmetic circuit computes an updated offset value at a time determined by the counter generating the event.

3. The automatic test system of claim 2, wherein:
   the value in the programmable element is the number of samples collected at each increment.

4. The automatic test system of claim 3, wherein:
   the programmable element is a first programmable element;
   the timing circuit comprises a second programmable element;
   the counter is a first counter;
   the number of events is a first number of events;
   the timing circuit comprises a second counter coupled to the second programmable element and the first counter, the second counter generating an event based on counting a second number of events generated by the first counter, wherein the second number of events is specified by a value stored in the second programmable element; and
   the arithmetic circuit resets the offset value at a time determined by the second counter generating the event.

5. The automatic test system of claim 1, wherein:
   the output circuit comprises a vernier with a timing resolution less than 2 psec.

6. The automatic test system of claim 1, wherein:
   the test system is clocked by a digital clock having a plurality of cycles;
   the output circuit comprises:
      a counter coupled to the arithmetic circuit; and
      a programmable delay coupled to the arithmetic circuit and the counter;
   the counter is configured to receive a first portion of the computed offset and the programmable delay is configured to receive a second portion of the computed offset, the second portion representing a smaller range of times than the first portion;
   the counter is clocked by the digital clock and is configured to output a counter event in response to counting a number of cycles of the digital clock indicated by the first portion; and
   the programmable delay is coupled to receive the counter event and to produce the event in the signal at the output of the output circuit in response to a passage of time proportional to the second portion of the offset following the counter event.

7. The automatic test system of claim 6, wherein:
the range of times represented by the second portion of the offset is less than a cycle of the digital clock.

8. The automatic test system of claim 1, further comprising:
a RAM configured to store samples taken by the pin electronics circuit in response to events in a signal at the first timing input.

9. The automatic test system of claim 8, wherein:
the RAM comprises a failure capture RAM of the automatic test system.

10. The automatic test system of claim 8, wherein:
the automatic test system further comprises a failure capture RAM; and
the RAM is distinct from the failure capture RAM.

11. The automatic test system of claim 8, further comprising:
a processor coupled to the RAM, the processor configured to process the samples stored in the RAM to identify a timing of a transition within a signal at the signal input.

12. The automatic test system of claim 1, wherein:
the automatic test system is clocked by a clock with a period different than a rate at which the repeated waveform is repeated;
the automatic test system further comprises a timing generator that:
generates an event in the signal at the second timing input synchronous with the clock of the test system; and
provides to the timing circuit a residue representing a time difference between the event in the signal at the second timing input and a start of a repetition of the repeated waveform; and
the arithmetic circuit computes the offset further based on the residue.

13. The automatic test system of claim 1, wherein:
the sample taken by the pin electronics circuit indicates whether the value at the signal input is above a programmed level.

14. The automatic test system of claim 1, wherein:
the programmable element comprises a programmable element of a plurality of programmable elements;
the arithmetic circuit computes the offset based at least in part on values stored in the plurality of programmable elements; and
the values in the plurality of programmable elements define at least two of:
a start time of the programmable window,
a number of increments within the programmable window at which samples are collected, or
a number of samples collected at each increment.

15. A method of operating an automated test system to collect a plurality of samples in a programmable window of a repetition of a repeated waveform, the method comprising:
receiving at least one programmed value indicating at least one of a number of increments within the programmable window at which samples are collected and/or a number of samples collected at each increment within the window;
generating multiple repetitions of the repeated waveform;
repeatedly:
computing an offset applicable to a respective repetition of the multiple repetitions, the computing being based at least in part on the at least one programmed value; and
in a repetition of the multiple repetitions, obtaining a sample of the repeated waveform at a time determined based at least in part on the computed offset applicable in the respective repetition.

16. The method of claim 15, wherein:
a same computed offset is applicable in a number of successive repetitions, the number of successive repetitions being based on a received programmed value of the at least one programmed values indicating the number of samples collected at each increment.

17. The method of claim 16, wherein:
the computed offset is incremented after the number of successive repetitions based on the received programmed value of the at least one programmed values indicating the number of samples collected at each increment, the computed offset being incremented by an amount based on a received programmed value of the at least one programmed values indicating a time between increments within the programmable window at which samples are collected.

18. The method of claim 17, wherein:
the computed offset is reset after it is incremented a number of increments that is based on the received programmed value of the at least one programmed values indicating the number of increments within the programmable window at which samples are collected.

19. The method of claim 15, wherein:
the sample is obtained at a time determined based on the offset relative to an event in a timing signal, the event indicating a repetition of the repeated waveform, and the event being synchronous with the repetition of the repeated waveform.

20. The method of claim 15, wherein:
the sample is obtained at a time determined based on the offset relative to an event in a timing signal, the event indicating a repetition of the repeated waveform, and the event being asynchronous with the repetition of the period repeated; and
repeatedly computing the offset comprises computing the offset further based in part on a residue value indicative of a difference between the event in the timing signal and a point during the repetition of the repeated waveform.

21. The method of claim 20, wherein:
generating multiple repetitions of the repeated waveform comprises controlling a device under test with stimulus signals generated by the automated test system;
the automated test system generates the stimulus signal in accordance with a test system clock comprising a plurality of periods; and
the method further comprises generating the event in the timing signal to indicate a period of the test system clock corresponding with a start of the window.

22. The method of claim 15, wherein:
the received program values comprise a plurality of values indicating at least two of the start time of the window, the duration of the window, the sampling increment within the window and/or number of samples at each increment within the window.

23. The method of claim 15, wherein:
a plurality of samples are collected by repeatedly obtaining a sample; and
the method further comprises analyzing the plurality of samples.

24. The method of claim 23, wherein:
analyzing the plurality samples comprises averaging multiple sets of samples, each set of samples corresponding to samples at an increment of a plurality of increments within the window.

25. The method of claim 23, wherein:
analyzing the samples comprises identifying a transition in the repeated signal occurring within the window.

26. The method of claim 15, wherein:
repeatedly computing the offset and obtaining the sample is repeated in each of the multiple repetitions of the repeated waveform.

27. An instrument for an automated test system, the instrument configured for collecting a plurality of samples in a programmable window of a repetition of a repeated waveform, the instrument comprising:
a pin electronics circuit that samples a signal at a signal input to the instrument at a time specified by an event in a timing signal at a timing signal input; and
a circuit coupled to the timing signal input, for generating the timing signal, the circuit comprising a triggering input and being configured to generate events in the timing signal corresponding to events in a signal at the triggering input, the circuit comprising:
an accumulator comprising at least a first input and a clock input, the accumulator increasing an accumulated value by an amount proportional to a value at the first input in response to an event at the clock input;
a first programmable register coupled to the first input of the accumulator;
a second programmable register; and
a counter having inputs coupled to the second programmable register and the triggering input and an output coupled to the clock input of the accumulator, the counter configured to output an event on the output upon counting a number of events in a signal at the triggering input, the number being dictated by a value in the second programmable register, wherein the accumulator is coupled to the pin electronics circuit such that the accumulated value defines, at least in part, the timing signal.

28. The instrument of claim 27, wherein:
the pin electronics circuit further comprises:
an edge generator having an input coupled to the timing signal input, the timing signal input comprising an event signal input and a residue input and an edge output, the edge generator generating an edge at the edge output following an event in a signal at the event signal input by an amount determined by a valve at the residue input; and
a sampling circuit coupled to the edge generator, the sampling circuit taking a sample in response to an edge in the edge output.

29. The instrument of claim 28, wherein:
the counter comprises a first counter; and
the circuit comprises a second counter, the second counter receiving a first portion of a timing value computed based on the accumulated value and outputting an event based on the first portion, the event being coupled to the event signal input of the pin electronics circuit;
a second portion of the timing value being coupled to the residue input of the pin electronics.

* * * * *